(12) United States Patent   (10) Patent No.: US 7,241,428 B2
Chiu   (45) Date of Patent: *Jul. 10, 2007

(54) HIGHLY EFFICIENT COMPACT CAPACITANCE COUPLED PLASMA REACTOR/GENERATOR AND METHOD

(75) Inventor: Kin-Chung Ray Chiu, Sunnyvale, CA (US)

(73) Assignee: DryScrub, ETC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/232,754

(22) Filed: Sep. 21, 2005

(65) Prior Publication Data

US 2006/0013747 A1 Jan. 19, 2006

Related U.S. Application Data

(60) Continuation of application No. 10/418,562, filed on Apr. 16, 2003, now Pat. No. 6,967,007, which is a division of application No. 09/553,696, filed on Apr. 21, 2000, now Pat. No. 6,576,202.

(51) Int. Cl.
*B01J 19/08* (2006.01)
(52) U.S. Cl. ............. 422/186; 422/186.04; 422/186.18
(58) Field of Classification Search ................ 422/186, 422/186.04, 186.18
See application file for complete search history.

(56) References Cited

U.S. PATENT DOCUMENTS

| | | | |
|---|---|---|---|
| 3,815,000 A | 6/1974 | Phillips et al. | |
| 3,976,448 A | 8/1976 | Eng et al. | |
| 3,979,193 A | 9/1976 | Sikich | |
| 4,130,490 A | 12/1978 | Lovelace et al. | |
| 4,148,705 A | 4/1979 | Battey et al. | |

(Continued)

FOREIGN PATENT DOCUMENTS

CA C1282732 4/1991

(Continued)

OTHER PUBLICATIONS

"Energy-Efficient Removal of Gaseous LPCVD Byproducts," Process Technology Limited PTL News Spring 1986 vol. 1, No. 3 (3 pages).

(Continued)

*Primary Examiner*—Rodney G. McDonald
(74) *Attorney, Agent, or Firm*—Townsend and Townsend and Crew LLP

(57) ABSTRACT

A compact capacitively coupled electrode structure for use in a gas plasma reactor/generator is disclosed. The electrode structure comprises a parallel plate type anode and cathode spaced to define a gas flow path or volume therebetween. A plurality of electrically conductive fin elements are interposed in the space between the anode and cathode. The fin elements substantially increase the ratio of electrode surface area to volume, and subdivide the gas flow path or volume, thereby substantially increasing the efficiency of plasma gas processing that is possible over a broad range of operating parameters, without substantially increasing the spacing between the anode and cathode. Static or closed operation is also disclosed. Also disclosed is a multi-anode/multi-cathode electrode assembly embodying the basic electrode structure and a highly efficient and compact gas plasma reactor/generator employing the assembly.

17 Claims, 8 Drawing Sheets

U.S. PATENT DOCUMENTS

| | | | |
|---|---|---|---|
| 4,189,308 A | 2/1980 | Feldman | |
| 4,209,357 A | 6/1980 | Gorin et al. | |
| 4,285,800 A | 8/1981 | Welty | |
| 4,313,739 A | 2/1982 | Douglas-Hamilton | |
| 4,381,965 A | 5/1983 | Maher et al. | |
| 4,438,706 A | 3/1984 | Boday et al. | |
| 4,443,409 A | 4/1984 | Saccocio | |
| 4,472,174 A | 9/1984 | Chuan | |
| 4,491,606 A | 1/1985 | Rosler et al. | |
| 4,492,971 A | 1/1985 | Bean et al. | |
| 4,509,434 A | 4/1985 | Boday et al. | |
| 4,526,670 A | 7/1985 | Hajj | |
| 4,554,045 A | 11/1985 | Bean et al. | |
| 4,631,105 A | 12/1986 | Carroll et al. | |
| 4,644,877 A | 2/1987 | Barton et al. | |
| 4,695,358 A | 9/1987 | Mizuno et al. | |
| 4,735,633 A | 4/1988 | Chiu | |
| 4,792,378 A | 12/1988 | Rose et al. | |
| 4,887,005 A | 12/1989 | Rough et al. | |
| 5,009,738 A | 4/1991 | Gruenwald et al. | |
| 5,146,140 A | 9/1992 | Piejak et al. | |
| 5,304,486 A | 4/1994 | Chang | |
| 5,330,578 A | 7/1994 | Sakama et al. | |
| 5,415,719 A | 5/1995 | Akimoto | |
| 5,543,688 A | 8/1996 | Morita | |
| 5,820,947 A | 10/1998 | Itoh | |
| 6,007,672 A | 12/1999 | Saito et al. | |
| 6,119,455 A | 9/2000 | Hammer et al. | |
| 6,146,599 A | 11/2000 | Ruan et al. | |
| 6,159,432 A | 12/2000 | Mallison et al. | |
| 6,576,202 B1 | 6/2003 | Chiu | |
| 6,967,007 B2 * | 11/2005 | Chiu | 422/186 |

FOREIGN PATENT DOCUMENTS

| | | | |
|---|---|---|---|
| DE | 2332418 | | 12/1974 |
| DE | 215706 | | 11/1984 |
| DE | 230790 | | 12/1985 |
| DE | 3609698 | | 9/1987 |
| DE | 3850816 | | 9/1994 |
| EP | 158823 | A2 | 3/1985 |
| EP | 176295 | A2 | 9/1985 |
| EP | 0166846 | | 1/1986 |
| EP | 296720 | A2 | 5/1988 |
| EP | 296720 | B1 | 5/1988 |
| EP | 0304824 | | 3/1989 |
| EP | 767254 | A1 | 4/1997 |
| EP | 781599 | A2 | 7/1997 |
| EP | 839930 | A1 | 5/1998 |
| FR | 2591509 | | 8/1987 |
| GB | 2113815 | A | 8/1983 |
| GB | 2158055 | A | 11/1986 |
| JP | 51129868 | | 11/1976 |
| JP | 56108514 | | 8/1981 |
| JP | 58006231 | | 1/1983 |
| JP | 58045718 | | 3/1985 |
| JP | 60137421 | | 7/1985 |
| JP | 60193522 | | 10/1985 |
| JP | 06331523 | | 2/1988 |
| JP | 63285936 | | 11/1988 |
| JP | 10335091 | | 12/1988 |
| JP | 08115879 | | 5/1996 |
| JP | 11-005013 | | 1/1999 |

OTHER PUBLICATIONS

Adams, A., "Plasma Deposition of Inorganic Films," Solid State Technology, Dec. 1980 (5 pages).

Adams, A., "Silicon Nitride and Other Insulator Films," Plasma Deposited Thin Films 1986 pp. 130-133; 156-159.

Bailin et al, "Microwave Decomposition of Toxic Vapor Simulants," Environmental Science and Technology, vol. 9, No. 3, Mar. 1975 pp. 254-257.

Bell et al, "Techniques and Applications of Plasma Chemistry," Chapter 1: Fundamentals of Plasma Chemistry pp. 1-49, Published by John Wiley & Son, Inc. 1974.

Boeing et al, "Fundamentals of Plasma Chemistry and Technology," Properties of Glow Discharge Plasma pp. 49-53, VI Plasma Chemistry, pp. 55-74, VIII Plasma Enhanced Deposition of Films pp. 89-133 published by Technomic Publishing Company 1988.

Chiu et al, "Plasma Etch Process Modeling: Application to Al Etch Process Development," 1983 pp. 294-299.

Chiu et al, "Modeling of BPSG Film Deposition" (16 pages).

Chiu et al, "Plasma Etch Process Modeling," 1983 pp. 74-81.

D'Agostino et al, "Chemical Mechanisms in $C_3F_8$-$H_2$ Radiofrequency Discharges," Plasma Chemistry and Plasma Processing, vol. 4, No. 1, 1984.

Flamm et al, "The Oxidation of Methane Traces, Formation of Ozone and Formation of $No_x$ in RF Glow and DC Corona Discharges," TUPAC International Symposium on Plasma Chemistry, Limoges, France, Jul. 1977.

Fraser et al, "Decomposition of Methane in an AC Discharge," Plasma Chemistry and Plasma Processing, vol. 5, No. 2 1985 pp. 163-173.

Gorczyca, T., VLSI Electronics Microstructure Science, vol. 8 Chapter 4: "Plasma-Enhanced Chemical Vapor Deposition of Dielectrics," Plasma Processing for VLSI 1984 CRC Press, Inc. pp. 69-76.

Hammond, M., "Safety in Chemical Vapor Deposition," Solid State Technology Dec. 1980 (5 pages).

Hirose, M., Plasma Deposited Thin Films Chapter 2: "Plasma-Deposited Films; Kinetics of Formation, Composition, and Microstructure," 1986 pp. 28-32; 42-43.

Jacob, A., "Plasma Processing—An Art or a Science?" (5 pages).

Johnson, W., "Design of Plasma Deposition Reactors," Solid State Technology Apr. 1983 pp. 191-195.

Kern et al, Technical Report: "Advances in Deposition Processes for Passivation Films" 1977 Applied Materials, Inc. pp. 1092-1094.

Matteson et al, Abstract: "Corona Discharge Oxidation of Sulfur Dioxide," Environmental Sci. Tech. 6,895 (1972) (1 page).

Raoux S. et al, "A Plasma Reactor for Solid Waste Treatment on PECVD Production Systems", Mat. Res. Soc. Symp. Proc. vol. 447 (1997 Materials Research Society) pp. 101-105.

Raoux et al, "Growth, Trapping and Abatement of Dielectric Particles in PECVD Systems," Plasma Sources Sci. Technol. 6 1997 pp. 405-414.

Reif, R., "Plasma-Enhanced Chemical Vapor Deposition of Silicon Epitoxial Layers," J. Electrochem. Soc.: Solid-State and Technology Oct. 1984 pp. 2430-2435.

Siebert, M., Final Comprehensive Report: "Vapor Decomposition by Microwave Discharge," Sep. 1971 pp. 1-61.

Singer, P., "Pre-pump Scrubbers Simplify Maintenance and Improve Safety," Semiconductor International Mar. 1992 pp. 72-74.

Venugopalan, M., "Reaction Under Plasma Conditions—vol. 2," Chapter Eleven: Plasma Chemistry—An Introduction pp. 1-31 Published by John Wiley* & Sons, Inc. 1971.

* cited by examiner

HIGHLY EFFICIENT COMPACT CAPACITANCE COUPLED PLASMA REACTOR/GENERATOR AND METHOD

RELATED APPLICATIONS

This application is a continuation of and claims the benefit of U.S. patent application Ser. No. 10/418,562 filed Apr. 16, 2003, which issued as U.S. Pat. No. 6,967,007 on Nov. 22, 2005, and which is a division of and claims the benefit of U.S. patent application Ser. No. 09/553,696 filed Apr. 21, 2000, which issued as U.S. Pat. No. 6,576,202 on Jun. 10, 2003.

FIELD OF THE INVENTION

The present invention relates to gas ionization apparatus and methods generally and more specifically to capacitance coupled gas plasma reactors and methods.

BACKGROUND OF THE INVENTION

Capacitance coupled plasma reactors are usually constructed with a pair of parallel plate electrodes facing each other, spaced apart in parallel, and placed inside a vacuum chamber. An external electric field, either DC or AC, is applied to the opposite electrodes. Under low pressure and with proper spacing between the electrodes, a stable plasma can be generated and maintained by first ionizing and then creating a glow discharge in gas flowing between the electrodes. Multiple pairs of alternating polarity parallel plates can be spaced apart and/or stacked together to form multiple regions where plasma discharge may occur. Such capacitance coupled plasma reactors have been widely used in a variety of industries for applications such as substrate etching, substrate cleaning, substrate film deposition, gas treatment, ion beam source and for various chemical reactions.

As the term "capacitance coupled plasma" implies, the electrodes form a capacitor, typically of the parallel plate type. The most fundamental type is simply two flat plates of opposite electrical polarity and is often referred to as a "planar diode." The electrodes may be arranged in a variety of geometric configurations, including configurations having curved surfaces, such as concentric parallel cylinders or concentric spheres with parallel tangents. Typically the surfaces of the alternate polarity electrodes will be equally spaced throughout the structure to maintain the parallel plate relationship. The geometric regularity and symmetry between the surfaces of the electrodes in such structures are thought to be desirable for the production of a uniform electric field and hence a more uniform plasma. Concave or convex pairs of flat plate electrodes have also been used to focus or defocus the intensity of the plasma concentration in specific regions for special applications such as focus sputtering, focus etching or to provide a focused ion source. A number of prior art capacitively coupled parallel plate electrode designs having different geometric configurations are taught in U.S. Pat. No. 4,735,633, entitled Method and System for Vapor Extraction From Gases, which issued to the inventor of the present invention and is assigned to the assignee of the present invention. The electrode configurations taught in the '633 patent provide large surface area to volume ratio for compact plasma reactors. Reactors employing electrode configurations as taught in the '633 patent have been successfully used in industry to provide greater than 99% reaction efficiency.

In addition to electrode spacing, another critical parameter for plasma generation and maintenance in capacitively coupled plasma reactors is the operating pressure. A stable glow discharge plasma can be more efficiently and easily maintained at lower pressures. This is because the production and maintenance of the plasma depends on the ionization of gas molecules in the reactor volume to produce sufficient secondary electrons to participate in the cascade collisional ionization process to offset and balance the loss of electrons (and ions) to the electrode surfaces. The mean free path, i.e., the average distance a primary electron will travel in the reactor volume before colliding with a molecule to create secondary electrons, depends upon the operating pressure. Generally, the higher the pressure, the smaller the value of the mean free path. The value of the mean free path places a limitation on the distance in which primary electrons within the electric field potential between the electrodes can accelerate to acquire the ionization potential energy needed to facilitate the ionization process. Thus, the smaller the value of the mean free path, the less ionization potential energy an electron will acquire for a given operating potential before colliding with a gas molecule, and the less secondary ionization is likely to occur.

For a given operating pressure, the electrode spacing determines the number of mean free path ionization collisions an electron will be involved in before it reaches and is lost to the electrode surface. For very short electrode spacing, no glow discharge can be generated and maintained. This space is known as dark space. Once a plasma is ignited in the reactor volume, it becomes a conducting sheet itself equivalent to an electrode. Between the plasma and the electrodes, there is always a space gap in which glow discharge ionization does not occur. Only ions and electrons are accelerated in this gap without further glow ionization discharge, and such space is the known as the "dark space shield." The thickness of the dark space shield is also pressure dependent.

Thus, the point at which the gas molecules will break down and a stable glow discharge plasma can be generated and maintained depends on the relationship of the applied external electric field potential, the breakdown voltage, the electrode spacing and the operating pressure. Paschen experimentally found that the breakdown potential voltage (V) varies with the product of pressure P (in units of Torr) and the electrode spacing d (in units of cm). The relationships Pashen identified are known as the law of glow discharge and are reflected in the "Paschen curves" shown in FIG. 1. FIG. 1 shows Paschen curves 10 for several different gases. The electrode design for a capacitively coupled, parallel plate plasma reactor must adhere to the physical requirements shown by the Paschen curves.

The Paschen curves 10 of FIG. 1 show there is a minimum breakdown voltage (V) for every gas for the product of Pd at about 1 Torr-cm, i.e., at about point 15. Thus, in practical terms, if the spacing between parallel plate electrodes is fixed at about 1 cm, the lowest external voltage necessary to apply to the electrodes to initiate ionization and breakdown of a gas under vacuum is obtained at a pressure of about 1 Torr. As can be seen from the Paschen curves 10, for a given electrode spacing d, as the pressure P increases, the minimum external voltage necessary to satisfy the 1 Torr-cm breakdown parameter slowly increases. However, as pressure is reduced, the minimum necessary voltage sharply increases (in linear scale of Pd). Thus, for example, given a power supply that can provide a maximum voltage of 1000 V, a reactor with fixed electrode spacing of about 1 cm can be operated at pressures up to about 300 Torr for neon gas, for example for neon light applications. But the same 1000V power supply will not be capable of generating and maintaining a plasma in Neon gas at pressures below about 0.1 Torr unless the electrode spacing is increased several times, such that the breakdown voltage 15 of the Paschen curve 10 occurs at a Pd value below the 1000V maximum supply limit.

Thus, in practical application, the relationships shown in the Paschen curves 10 determine the minimum electrode spacing and hence the minimum size for a reactor for a given power supply rating and operating pressure range. In most applications, it is desirable to use a low voltage power supply, either AC or DC, rather than a high voltage power supply because of the intrinsically lower cost of lower voltage supplies. It is also desirable to use smaller spacing between electrodes so that the reactor will be smaller and more compact. However, when operating at pressures below about 0.5 Torr, which may be required in certain applications such as in many semiconductor processing applications, it is a must to increase the electrode spacing to a few centimeters or more, thus increasing the reactor size, or alternatively to employ considerably more expensive high voltage power supplies. Though additional magnetic field sources could be used to confine the plasma in very low pressure operation application, this solution is very costly, further complicates and upsets the capacitive coupling of the applied and dissipated plasma energy, and introduces more side effects.

The aforementioned '633 patent teaches to maximize the efficiency of a reactor of a given size by maximizing the surface area of the electrodes within the reactor volume in a specific way to increase the reaction efficiency. Although the reactor taught in the '633 patent was primarily intended for use in semiconductor fabrication applications to break down and dispose of noxious exhaust gases, the plasma processing described in the patent also provides a very efficient means to process materials, such as by sputtering, etching, deposition, surface treatment, etc. It also provides an efficient gaseous chemical reaction means to produce desirable byproducts, for example chemical synthesis, polymer formation, chemical dissociation, etc. Advantages of this type of plasma processing over other chemical methods include substantially reduced energy consumption and substantially improved reaction efficiency at relatively low temperatures. One plasma reactor of the type taught in the '633 patent that has been used commercially is trademarked DryScrub® and is sold by the assignee of the present invention. As taught in the '633 patent, the DryScrub® reactor takes advantage of a large electrode surface area to plasma volume ratio and a long gas flow path to maximize chemical reaction on the electrode surfaces. This maximizes the reaction rate and reaction efficiency compared to gas phase reaction in the gas stream itself.

Thus, as taught in the '633 patent, for a pair of parallel plate electrodes, the area of the face of each surface of each electrode is A, and the total surface area of the opposing faces of the pair of electrodes is 2A. The volume enclosed between the faces is 2Ad for a fixed spacing d between electrodes. For low-pressure operation, the electrode spacing d must be increased for the reasons previously described. The plasma volume also increases with an increase in the electrode spacing d, and therefore the surface area to volume ratio decreases inversely proportional to increased spacing d. Thus, a decrease in operating pressure will result in the loss of some or all of the surface reaction advantages unless the surface area of the electrodes can somehow be increased. Of course, one way to increase the surface area of the electrodes is to increase the size of the reactor and hence the electrodes. However, for various reasons, including cost, as well as application or design constraints, this may not be desirable or even feasible. Therefore, it is necessary to find a way to further increase the surface area of the electrodes within the reactor volume without increasing the size of the reactor for low pressure applications, among other things.

The present invention addresses this problem by providing a new and unique electrode design. A primary objective of the new electrode design is to substantially increase the surface area of the electrodes without substantially increasing the volumetric size of the reactor. The new electrode design provides highly efficient electrode surface reactions over a significantly broadened range of operating parameters in capacitively coupled parallel plate plasma reactors and methods of the type taught in the '633 patent without any significant increase in size of the reactor. As such, the new electrode design also greatly increases the range of applications for such reactors and methods.

SUMMARY OF THE INVENTION

The conventional thinking, as demonstrated in the '633 patent, has been to configure pairs of parallel plate electrodes with opposing faces extending laterally and without any intrusions into the open volume between the opposing or adjacent surfaces of the electrodes. It has been thought undesirable to have any surface portions extending or intruding into the space between the electrodes because that would reduce the distance between the electrodes at that point or those points. There has been a significant fear that this would create a short circuit path that would cause arcing between the electrodes. Thus, it has been thought desirable to design the electrodes so that their opposing surfaces should be as flat as possible and as smoothly curved as possible to avoid this perceived problem. Moreover, for the reasons discussed previously with respect to the Paschen curves, there has been a fear that reducing the spacing between electrodes could adversely impact the generation, maintenance and quality of the glow discharge plasma. This has been the conventional wisdom in the design and construction of electrodes.

The present invention contradicts the conventional wisdom relating to electrode design and construction. In the present invention, a pair of alternating polarity electrodes are configured with a plurality of "L-shaped" and "7-shaped" fin protrusions to form a so-called "L7" electrode structure. The protrusions extend into the open space between the adjacent opposing electrodes and are arranged in interleaved fashion. The electrodes with their interleaved protrusions form roughly square "L7" shaped channels with one or more spaces or gaps, for example at one or more diagonal corners. A more expansive embodiment employs a grid type design wherein multiple pairs of opposite polarity electrodes, each having protrusions, are stacked together such that the protrusions are interleaved in the space between the electrodes. The "L7" shape with the interleaved protrusions maintains the electrode spacing d between the parallel opposing faces of electrode pairs, but increases the electrode surface area within a given volume by four times or more. Numerous protrusion/fin geometries are possible including continuously curved surfaces or "W" shaped surfaces, which can provide even more surface area per unit of volume.

A plasma reactor/generator apparatus and method embodying the "L7" electrode design of the invention includes a reactor body with an open interior volume. The reactor body includes a gas inlet and a gas outlet. The electrode apparatus is preferably configured as a unitary assembly that can be inserted into and removed from the interior volume of the reactor as a unit. The electrode assembly is typically electrically insulated from the reactor body. In an open system, the electrode assembly is enclosed within the interior of the reactor body and defines a plurality of subdivided gas flow paths between the gas inlet and gas outlet. In a static or closed system, the electrode assembly subdivides or partitions the gas volume into a plurality of cells, which may be according to a desired pattern. A power source in electrical communication with the electrode assembly generates a voltage potential between pairs of adjacent opposite polarity electrodes sufficient to ignite and maintain a plasma in a selected gas to be processed in the reactor. In one aspect of the invention, a flow of gas is introduced into the gas inlet at selected pressure, flow rate, and temperature and traverses the subdivided flow paths adjacent the surfaces of the electrodes to the gas outlet. A plasma having multiple distinct regions, preferably in at least partial communication, is generated and results in a highly efficient and complete chemical reaction of the gas upon the surfaces of the electrodes, the reactor thus carrying out a selected process on or employing the gas. In another aspect of the invention, the plasma generator is a closed system containing a gas. The plasma is formed in the gas, for example to generate luminescence. In this aspect, the invention is a plasma generator.

DESCRIPTION OF THE SPECIFIC EMBODIMENTS

A description of the presently preferred embodiments of the invention will now be described with reference to the attached drawing.

Figure 2:
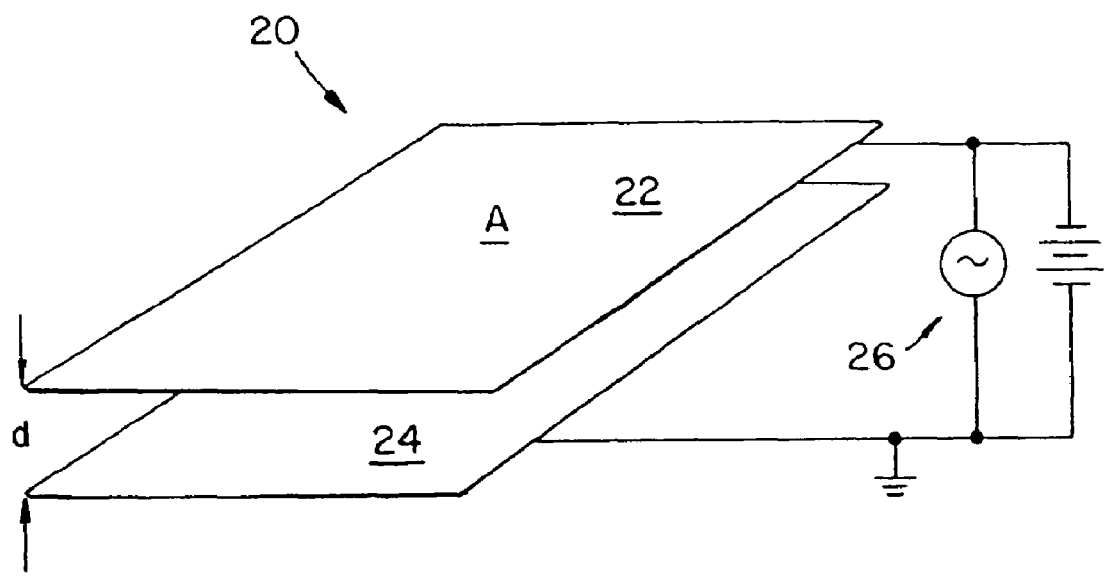
FIG. 2 is a graphical representation of a portion of a pair of conventional capacitively coupled parallel plate electrodes of the type used in conventional capacitively coupled parallel plate plasma reactors.

FIG. 2 provides a graphical illustration of a conventional capacitively coupled parallel flat plate electrode pair 20 of the type commonly used in almost all conventional plasma reactor designs today. Electrode pair 20 comprises first plate electrode 22 and second plate electrode 24. First and second plate electrodes 22 and 24 each has first and second surfaces, each surface having an area A. The facing surfaces of first and second electrodes 22 and 24 are separated or spaced apart by a fixed distance d. The plate electrodes comprise the plates of a parallel plate type capacitor with each electrode electrically coupled to the opposite terminal of a power supply 26, which may be either AC or DC type. Thus, at any given time, the electrodes 22 and 24 are of opposite polarity type, such that a voltage potential (V) is present between them for igniting and maintaining a glow discharge plasma in a gas flowing in the space between the electrodes. A simple calculation demonstrates that the total electrode surface area adjacent the open space between the electrodes is 2A and the total volume of space between the two electrodes is Ad. Thus, the ratio of electrode surface area to volume is 2/d cm-1 and, for a common electrode spacing of about 1 cm, the ratio of surface area to unit of volume is about two.

Figure 1:
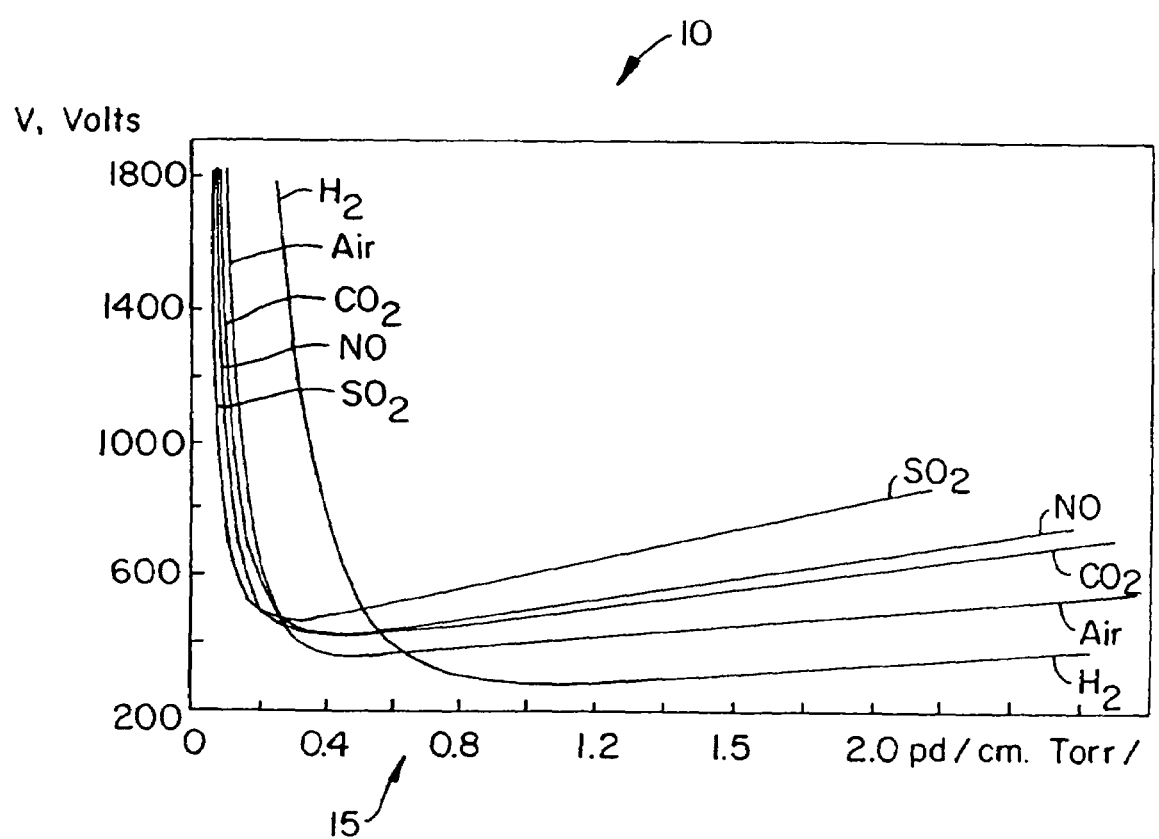
FIG. 1 is a graph illustrating Paschen curves for a number of typical gases.

The surface reaction principle taught in the prior art '633 patent is based on the knowledge that operating in a low pressure environment, a stable glow discharge can be easily maintained. By maximizing the electrode surface area per unit of plasma volume in the reactor, electrode surface reactions can be maximized. Large surface area provides a large reaction site for the gases to react on the surface. Absorbed and adsorbed gas molecules can easily find a site on the surface and fall population coverage ensures that when an ion or electron hits the surface there is a high probability a chemical reaction will be produced. Ignition and maintenance of the glow discharge depends on the operating pressure and electrode spacing as demonstrated by the Paschen curves of FIG. 1. The general rule of thumb is that for a parallel plate electrode, with the product of the anode-cathode spacing, d (cm), and the operating pressure P (Torr), i.e., Pd Torr-cm, at a value of about 1 Torr-cm, the minimum breakdown or plasma ignition voltage for most gases will occur at an electrode potential of about 250-350 volts.

For operating pressures between about 500-1000 mTorr, for example, the optimum spacing between the parallel plate electrodes would be about 1 cm. If the operating pressure is increased above this range, the spacing d could be narrowed slightly to maintain the optimum breakdown or plasma ignition voltage range. However, if pressure is reduced below this range, the spacing d would have to be increased drastically to maintain the optimum breakdown voltage. In other words, with changes in the required operating pressure, it is necessary to change the spacing d to maintain the operating Pd product as close to unity as possible if it is desired to maintain the breakdown or ignition voltage as close to the minimum as possible. Otherwise, for low pressure operation the power supply must be capable of providing very high voltages, well in excess of 1000V.

Thus, increasing the electrode spacing d is a typical approach used by the industry for years. For example, the reactive ion etching (RIE) method used for plasma etching substrates, such as semiconductors, employs a capacitance coupled electrode and an operating pressure in the range of 10 to 100 mTorr. In commercial reactors, the electrode spacing d is in the order of 5-15 cm. This results in maintaining a relatively low breakdown voltage as well as minimizing self-induced bias which can result in undesirable radiation damage to the substrate being etched from high-energy electron and ion bombardment.

The use of the larger electrode spacing d overcomes the difficulties with initiating gas ionization and plasma ignition and maintenance as governed by the Paschen relationships. But the larger electrode spacing has the undesirable effects of increasing the plasma volume, thereby requiring more reactor space and more electrode surface area, which adds significant expense. In order to construct an electrode having the same surface area to operate at low pressure, the electrode spacing and hence the volume must increase by multiples. However, if the reactor is designed with electrodes with larger surface area, it may be precluded from practical use in higher pressure ranges because the Pd product will be on the increasing end of the high pressure side of the Paschen curve.

Today almost all of the functional parallel plate plasma reactors are designed based on the foregoing principles. For example, if the electrode spacing d is about 1 cm it is relatively easy to generate and maintain a glow discharge plasma at a pressure about 1 Torr for almost all useable gases. Similarly, if the spacing d were 2 cm, the optimum operation pressure would be 0.5 Torr. The Paschen relationships also suggest that for a fixed electrode spacing d, the ability to generate and maintain a plasma will become slowly more difficult as operating pressure increases, and that the minimum breakdown voltage will increase slowly with rising pressure. Conversely, as operating pressure decreases, the minimum breakdown voltage to initiate the plasma increases rapidly and it is much more difficult to generate and maintain a plasma. The increase in the minimum breakdown voltage as operating pressure increases is explained physically by the fact that at higher operating pressures the main free paths of the gas molecules, atoms, and ionized ions and electrodes in the space between the electrodes are shorter. Multiple collisions may therefore occur between excited molecules, atoms, ions, and electrons prior to the excited particles reaching the electrodes. In each collision an excited particle loses energy and transitions from a higher energy state to a lower energy state. Thus, over time fewer and fewer particles having a sufficiently high energy state to initiate secondary ionization will be available and secondary ion and electron generation can become localized and more difficult. That condition will then require higher external operating voltage to generate and sustain the ionization breakdown process to maintain the plasma.

With lower operating pressure, longer mean free paths reduce the number of collisions of excited particles in the space between the electrodes. In that case, primary electrons that are accelerated between the electrodes by energy acquired from the external applied voltage (AC or DC) have a higher chance of colliding with an electrode before colliding with a gas molecule to ionize a neutral and produce more secondary electrons. More rapid loss of primary electrons combined with generation of fewer secondary electrons will require higher voltage from the external source to generate a stronger electric field and higher energy electrons to ensure initiation of the ionization process and to maintain the plasma. But higher field voltage accelerates the electrons faster and shortens the time before they are lost to the electrodes, thereby reducing the probability for secondary electron production collisions. Consequently, as the operating pressure is reduced, the minimum breakdown voltage required to initiate and maintain the plasma increases rapidly.

In many of today's plasma reactor applications, for example semiconductor fabrication applications, the plasma reactor is required to operate at pressure ranges below 100 mTorr. In order to operate at such low pressures, the electrode spacing in such reactors must be increased so that a plasma to be generated and maintained at a reasonable voltage that is below about 1000V. Even then high voltage plasma generators are far more costly than low voltage generators. Furthermore, in order to dissipate the same power, $P=IV$, operation at higher voltage means lower current will be dissipated in the plasma. Since the chemical reactions involved require electron exchange, lower current implies a lower chemical reaction rate. Therefore, to improve the efficiency of the plasma reactor, it would be more preferable to employ a lower voltage, higher current plasma.

At the same time, it is desirable to retain the successful features of prior reactor designs as taught in the '633 patent, such as the parallel plate design, optimum electrode spacing, high surface area to volume ratio, long flow path and compact footprint.

Figure 3:
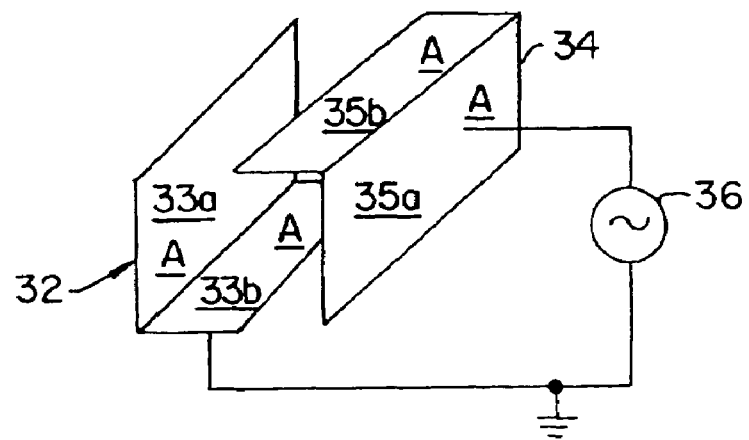
FIG. 3 is a graphical representation of a portion of a pair of capacitively coupled parallel plate electrodes embodying a preferred "L7" configuration according to the present invention.
Figure 4:
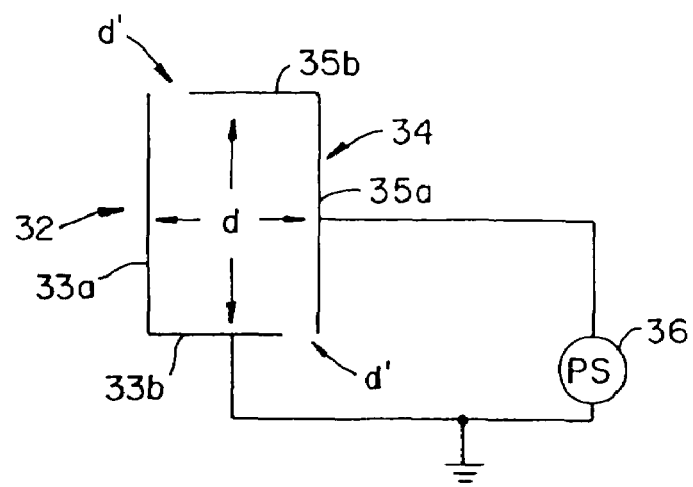
FIG. 4 is an end view of the pair of "L7" electrodes shown in FIG. 3.

FIGS. 3 and 4 provide a graphical illustration of the basic "L7" parallel plate electrode configuration, which comprises a basic preferred embodiment of the present invention. As described below, the "L7" electrode arrangement overcomes the shortcomings of the prior art, described above, while retaining the successful features of the prior designs as taught in the '633 patent.

The "L7" electrode arrangement comprises a first parallel plate electrode 32 and a second parallel plate electrode 34 arranged in conventional opposing relationship. The electrodes 32 and 34 are each electrically connected to an opposite terminal of a power supply 36, which may be either an AC or DC type suitable for use in capacitively coupled parallel plate plasma reactors. Thus, the electrodes 32 and 34 are of opposite polarity. Each electrode has a first surface 33a, 35a and a second surface 33b, 35b. In the preferred embodiment, the first and second surfaces are formed integrally and at right angles, although variations in both the construction and angle relationship are foreseeable. Surfaces 33a and 35a are spaced a fixed distance d from each other and their opposing faces are parallel to each other. Similarly, surfaces 33b and 35b are spaced a fixed distance d from each other and their opposing faces are parallel. Surfaces 33b and 35b protrude or extend into the open space between the parallel surfaces 33a and 35a such that the distal end of surface 33b approaches surface 35a and the distal end of surface 35b approaches the surface 33a. Thus, the "L7" electrode pair arrangement described can form an approximately square shaped long or subdivide a channel into individual cells. Preferably, the channels or cells are not completely enclosed. Small gaps are provided at one or more diagonal corners such that the electrodes are spaced apart by a distance d' between the distal end of surface 33b and surface 35a and the distal end of surface 35b and surface 33a. Each of the surfaces 33a, 33b, 35a, and 35b has an area of approximately A.

In this manner, the preferred "L7" electrode arrangement greatly increases the surface area to plasma volume ratio while retaining the same electrode spacing d. For example, the total surface area presented by the four surfaces to the square shaped channel or cell is 4A. The total volume remains Ad as in the conventional parallel plate electrode arrangement of FIG. 2. Thus, the surface area to volume ratio of the "L7" electrode pair arrangement is approximately 4/d cm-1 or twice the ratio of conventional parallel plate electrode pair arrangements.

The "L7" electrode pair arrangement contradicts conventional thinking regarding parallel plate electrode pair design. Conventional thought is against bringing protrusions or extensions such as surfaces 33b and 35a into the space between the parallel surfaces 33a and 35a, and certainly not into close proximity with those surfaces. The conventional thought has been that with the high volt potentials employed in many reactor applications, arcing will occur between the adjacent electrodes. However, by reexamining the meaning of the Paschen curves of FIG. 1 with deeper understanding, the inventor of the "L7" electrode design has determined that in the low pressure ranges at which the "L7" electrode is likely to find use, the space gap d' between the opposite polarity electrodes 32 and 34 at the corners can be made small enough so that the Pd' product will only permit a plasma to be generated and maintained in the gap at a value of breakdown voltage higher than what the power supply can provide. Thus, no plasma will exist in the gaps under those conditions. In addition, arcing and short circuit concerns are avoided under those operating conditions because the gap space d' is too short a distance for electrons to accelerate sufficiently to cause ionization. An arc or short circuit can only occur when continuous ionization creates a conducting path (like a lightening path) between the electrodes. These conditions cannot be physically present under the low pressure operating regime in which the "L7" electrode is primarily intended to be used. For example, a space gap of d'=0.5 cm with electrode spacing d=2 cm could allow the electrode to operate at pressure below 0.1 Torr with power supply voltage below 1000 V. When operating pressure is increased to a relatively high pressure such as 2 Torr, a suitable plasma can still be generated and maintained and will likely include the gap regions, however, so long as the gap distance d' is maintained short enough, no arcing or shorting will occur across the gaps.

Another reason why the inventor has determined that arcing and shorting across short gap distances d' is not a concern is that the critical requirement for arcing is the presence of a point concentration of discharge such that a high current conducting path is created between the point of discharge and the opposite electrode. In the "L7" electrode pair design, the electrodes form a conducting line such that there will be a distributed discharge along the entire line (instead of a point) between them. Thus, sufficient voltage is not built up at any given point on the electrodes under expected operating conditions to initiate a field emission wherein the electrons would have sufficiently high voltage potential above the breakdown voltage potential to ionize the entire conduction path between the electrodes. In other words, because the plasma generated between the electrodes in the "L7" design is well distributed along the entire opposing surfaces of the electrodes, insufficient potential is generated at any given point, including the points nearest the corners where the electrodes are in closest proximity, so that a complete conduction path between the electrodes can be ionized and arcing occur. Thus, arcing and shorting are not a concern despite conventional thinking to the contrary.

Another advantageous feature of the "L7" electrode arrangement is that it intrinsically provides variable spacing between the preferred perpendicular surfaces of the electrode pairs. The range of effective spacing extends from the gap space distance d' to the distance d between opposite parallel surfaces of the electrodes, i.e., surfaces 33a and 35a, or 33b and 35b. In fact there is an even larger distance of separation between the electrodes along the diagonal from the closed end corner of each electrode to the closed end corner of the other, i.e., from the point where surface 33a meets surface 33b to the point where surface 35a meets surface 35b. Thus, the new design intrinsically provides variable spacing between the electrodes to accommodate optimum operation at various pressures. The electrode design thus provides easy and efficient initiation and maintenance of a plasma over a broad range of operating conditions. Furthermore, as will be seen in more detail below, this design feature can be further extended. For example, with a horn shape electrode design having an open end of smaller cross section then the closed end further variable spacing range can be obtained, which will allow the plasma to select its optimal spacing under the operating conditions to initiate the plasma easily.

The variable electrode spacing inherent in the "L7" design and its extensions is a significant feature. Once a plasma is ignited, it becomes a conducting sheet, itself acting as an electrode with many conducting electrons present within it. Thus, the plasma itself is an additional electron source to sustain the loss of electrons to the electrodes. Thus, an easily ignited plasma is an easily maintained plasma, meaning that the "L7" electrode design will permit easy and efficient initiation and maintenance of plasmas over a broad range of operating conditions.

Figure 5:
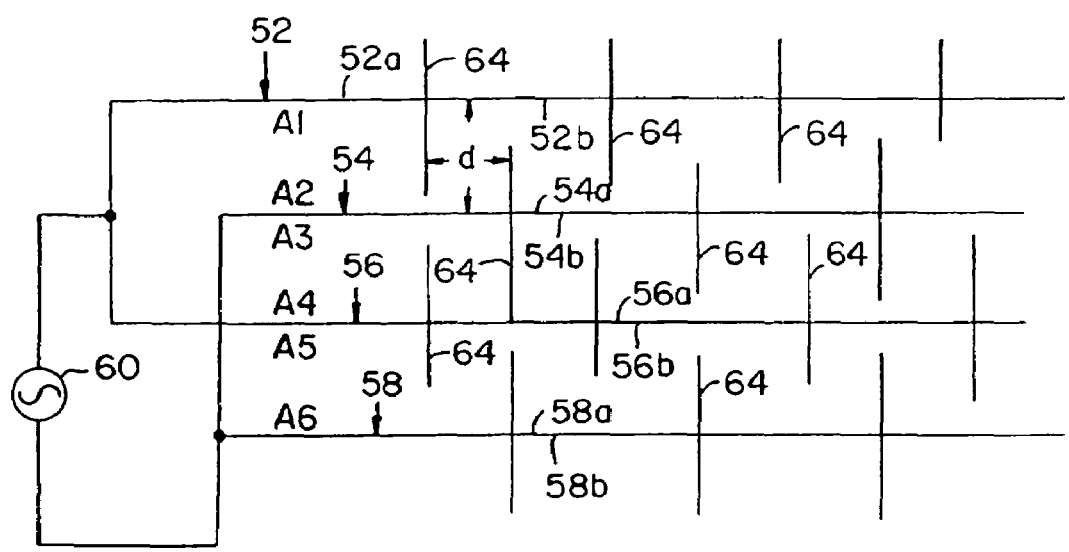
FIG. 5 is a side cutaway graphical representation of a stacked grid of "L7" electrode pairs with interleaved fins comprising a preferred embodiment of the present invention.

FIG. 5 illustrates graphically the extension of the basic "L7" electrode pair design to a stacked electrode pair electrode assembly configuration. Thus, FIG. 5 illustrates four electrodes 52, 54, 56, and 58 stacked in a vertical configuration. Each electrode has two opposite surfaces, thus electrode 52 has opposite surfaces 52a and 52b, electrode 54 has opposite surfaces 54a and 54b, electrode 56 has opposite surfaces 56a and 56b, and electrode 58 has opposite surfaces 58a and 58b. The electrodes are stacked such that their surfaces are all parallel to each other, thus surfaces 52a, 52b, 54a, 54b, 56a, 56b, 58a, and 58b are all parallel to each other. Electrodes 52 and 56 are connected in common to one terminal of a suitable AC or DC power supply 60 and electrodes 54 and 58 are connected to the opposite terminal of power supply 60. As a result the polarity of adjacent electrodes in the stacked assembly alternate and each adjacent pair of stacked electrodes forms an opposite polarity pair. Thus electrodes 52 and 54 form one opposite polarity pair, electrodes 54 and 56 form another pair and electrodes 56 and 58 form yet another pair. It is notable that the opposing sides, e.g., 54a and 54b, of the electrodes, e.g., 54, are both used, which greatly increases the electrode surface area for chemical reactions to occur in the reactor. Consistent with the basic "L7" design philosophy, each electrode has a plurality of "fins" or protrusions 64 extending at right angles from its opposite surfaces into the space between adjacent electrodes. Thus, the fins 64 extending from surface 52b of electrode 52 and the fins 64 extending from the opposite surface 54a of adjacent electrode 54 each extend into the open space between the adjacent electrodes into proximity with the adjacent electrode. As shown, for a variety of reasons it is preferred that the fins are located on adjacent electrodes of an electrode pair in an alternating or interleaved arrangement. For one, this helps to distribute the plasma between the adjacent electrodes of each electrode pair which in turn helps ensure that no point ionization sources will result in arcing or shorting between the electrodes. As will be explained further below, it also helps to compartmentalize the plasma, resulting in a qualitatively better plasma and therefore improved reaction efficiency.

Still further, it ensures a long and circuitous flow path for the gas being treated in the reactor, which also improves the reaction efficiency.

This extension of the basic "L7" electrode design maintains the improvement in surface area to plasma volume ratio with respect to prior parallel plate electrode configurations and multiplies it by stacking electrode pairs in the reactor volume. Assume the distance between adjacent fins 64 of the same electrode, e.g., electrode 52 is d, and the distance between opposing surfaces of adjacent electrodes in each pair, e.g., surface 52b of electrode 52 and surface 54a of electrode 54, is also d. Assume also that the surface area between the adjacent fins on each electrode is A and that the surface area of each fin is also approximately A. Then in each "cell" bounded by adjacent fins of an electrode, e.g., electrode 52, and the opposing parallel surfaces of the adjacent electrodes of each pair, e.g., surfaces 52b and 54a, the total electrode area is 4A. As in conventional parallel plate electrode designs, the electrode spacing is maintained as d, and therefore, the ratio of electrode surface area to plasma volume seen by the plasma in each cell or channel is approximately 4/d cm-1.

The "L7" design philosophy can be further extended to provide an even higher surface area to volume ratio by further subdividing the approximately square shaped "L7" channels into cubic cells having spacing of approximately d by adding additional fin elements as partitions. This results in the plasma in each approximately cubic partition seeing a surface to volume ratio of approximately 6/d cm-1.

Although the stacked "L7" electrode assembly of FIG. 5 is shown in cross section, those skilled in the art will understand that the electrodes 52-58 can be of various shapes. For example, as described below, each of the electrodes can be round. Similarly, although the fins 64 are shown in cross section, it will be understood that the fins can be of various shapes including straight surfaces, curved surfaces, "U" shaped, "V" shaped, "W" shaped and horn shaped. Still further, the electrodes need not be continuous surfaces, but may include one or more openings to facilitate gas flow. Similarly, the fins 64 need not be continuous surfaces, but may have openings for gas flow and plasma communication purposes.

Further, the dimensions and geometric shapes of the cells can be varied to modulate the plasma. For example, plasma intensity can be modulated among the cells according to a desired pattern. Areas of plasma focus and defocus can be generated. Plasma grids and pixels can also be generated. Such modulation effects can be made periodic or according to other desired patterns.

Similarly to the basic "L7" design, the fins 64 of adjacent electrodes, e.g., electrodes 52 and 54 extend into proximity with the opposing surfaces of the electrode pair, e.g., surfaces 52b and 54a, but remain separated by a gap distance d'. For the same reasons discussed with respect to the basic "L7" electrode design, if the gap distance d' is maintained small enough, then arcing and shorting between the electrodes is not a concern.

Figure 6:
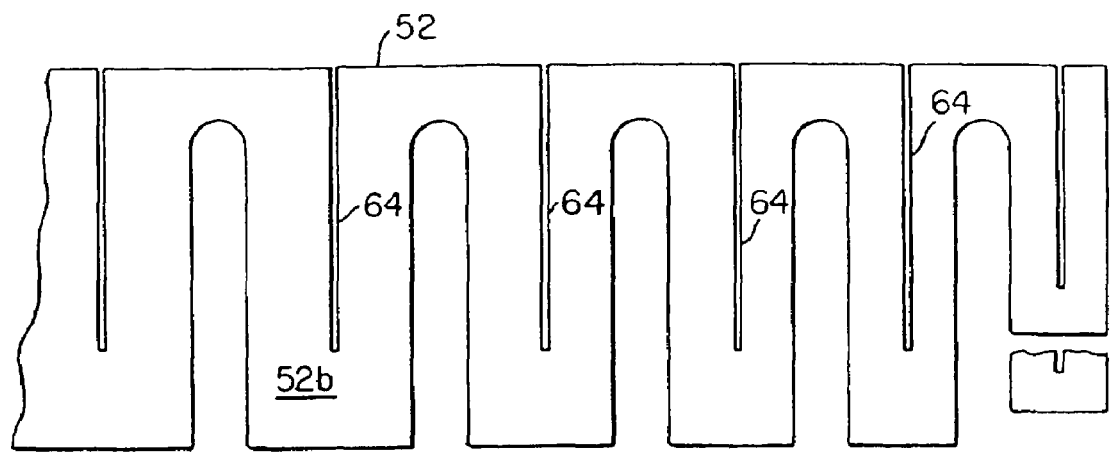
FIG. 6 is a plan view of a portion of a presently preferred embodiment of a first electrode forming an "L7" electrode pair with the second electrode of FIG. 7 for use in a stacked grid of "L7" electrode pairs as illustrated graphically in FIG. 5.
Figure 7:
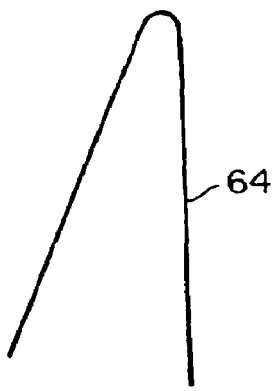
FIG. 7 is a plan view of a portion of a presently preferred embodiment of a second electrode forming an "L7" electrode pair with the first electrode of FIG. 6 for use in a stacked grid of "L7" electrode pairs as illustrated in FIG. 5.
Figure 8:
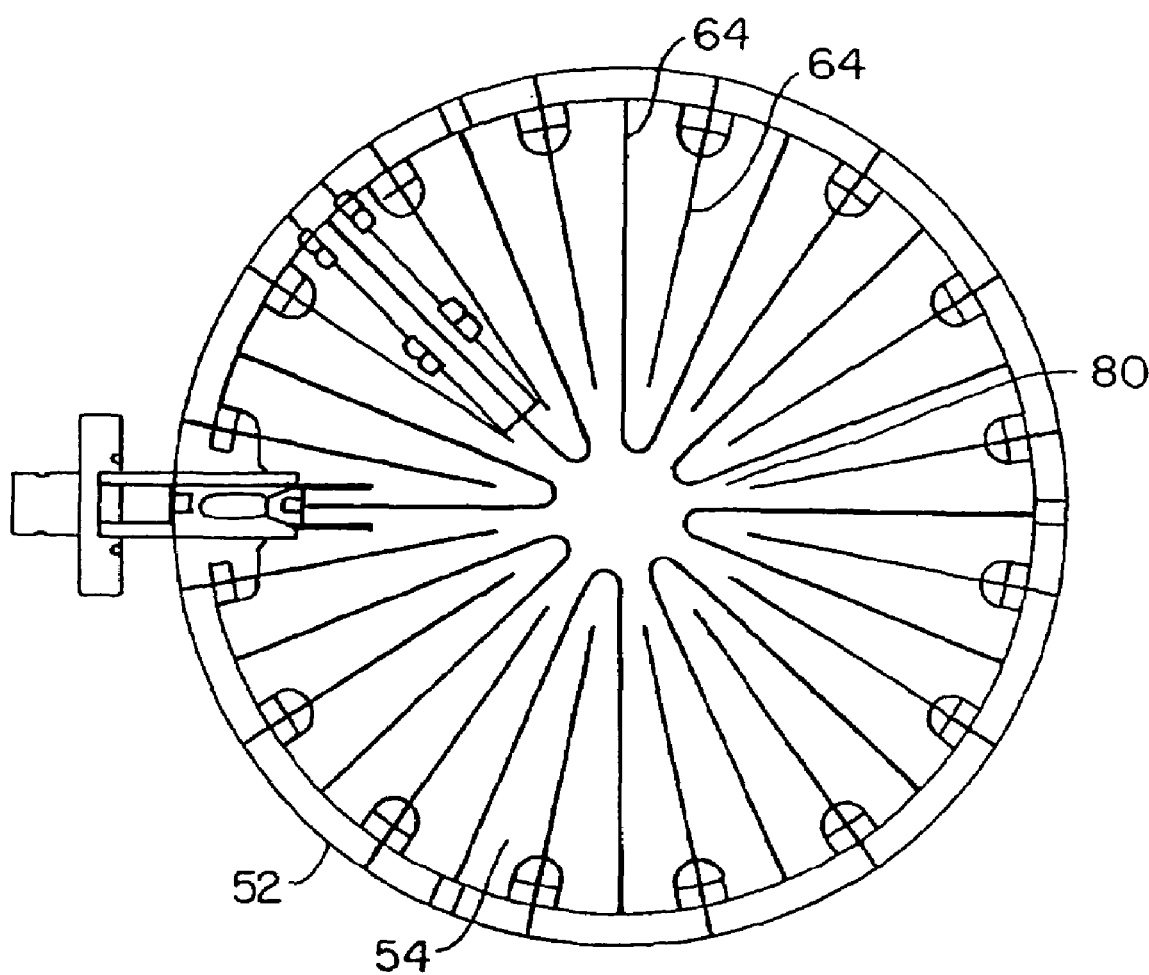
FIG. 8 is a cutaway plan view showing a preferred "L7" electrode pair comprising the electrodes of FIGS. 6 and 7 overlaid.

Referring to FIGS. 6-8, examples of preferred forms of fin elements, electrodes and electrode assemblies are shown. FIG. 6 is a plan view of a portion of one electrode of an opposite polarity electrode pair, e.g., electrode 52 of FIG. 5. The surface of electrode 52 shown in FIG. 6 is surface 52b for example. Preferably electrode 52 is round in shape as shown in FIG. 8. Fins 64 are straight surfaces that extend outwardly from the surface 52b substantially perpendicularly. FIG. 7 is a top plan view of another preferred fin shape, namely an open ended "horn" shape. The horn shaped fin shown in FIG. 7 extends outwardly from the surface 54a of electrode 54 in FIG. 5 for example. As shown in FIG. 8, a plurality of such horn shaped fins 64 are located on the surface 54a of electrode 54 for example so that the straight fins 64 extending from the surface 52b of electrode 52 will be interleaved or interdigitated between the sides of the horn fins 64 circumferentially around the entire surfaces of the adjacent electrodes 52 and 54. FIG. 8 thus shows via a cutaway plan view how the straight fins 64 and the horn shaped fins 64 are interdigitated or interleaved when round electrodes, e.g., electrodes 52 and 54, are stacked adjacent each other. Also as shown in FIG. 8, the preferred form of at least one of the electrodes of each pair, i.e., electrode 52 in this example, has a central opening 80 for the gas stream to flow through. Still further shown in FIG. 8 is that the diameter of the other electrode 54 will be slightly less than that of electrode 52 to permit gas flow over the edge of the electrode and into the next stacked electrode pair.

In addition to improving the electrode surface area to plasma volume ratio by inserting additional fin surface area into the space between the electrodes, the fins also significantly increase the flow path length of the gas stream by converting the flat wide path between the electrodes into multiple narrower paths. As mentioned previously, if desired the path can be even further subdivided into approximately cube-shaped cells by interposing additional fin elements in the "L7" shaped channels. The partitioning of the wider path significantly increases the electrode surface area encountered by the gas stream as it flows through the reactor, without increasing the volume or size of the reactor.

Figure 9:
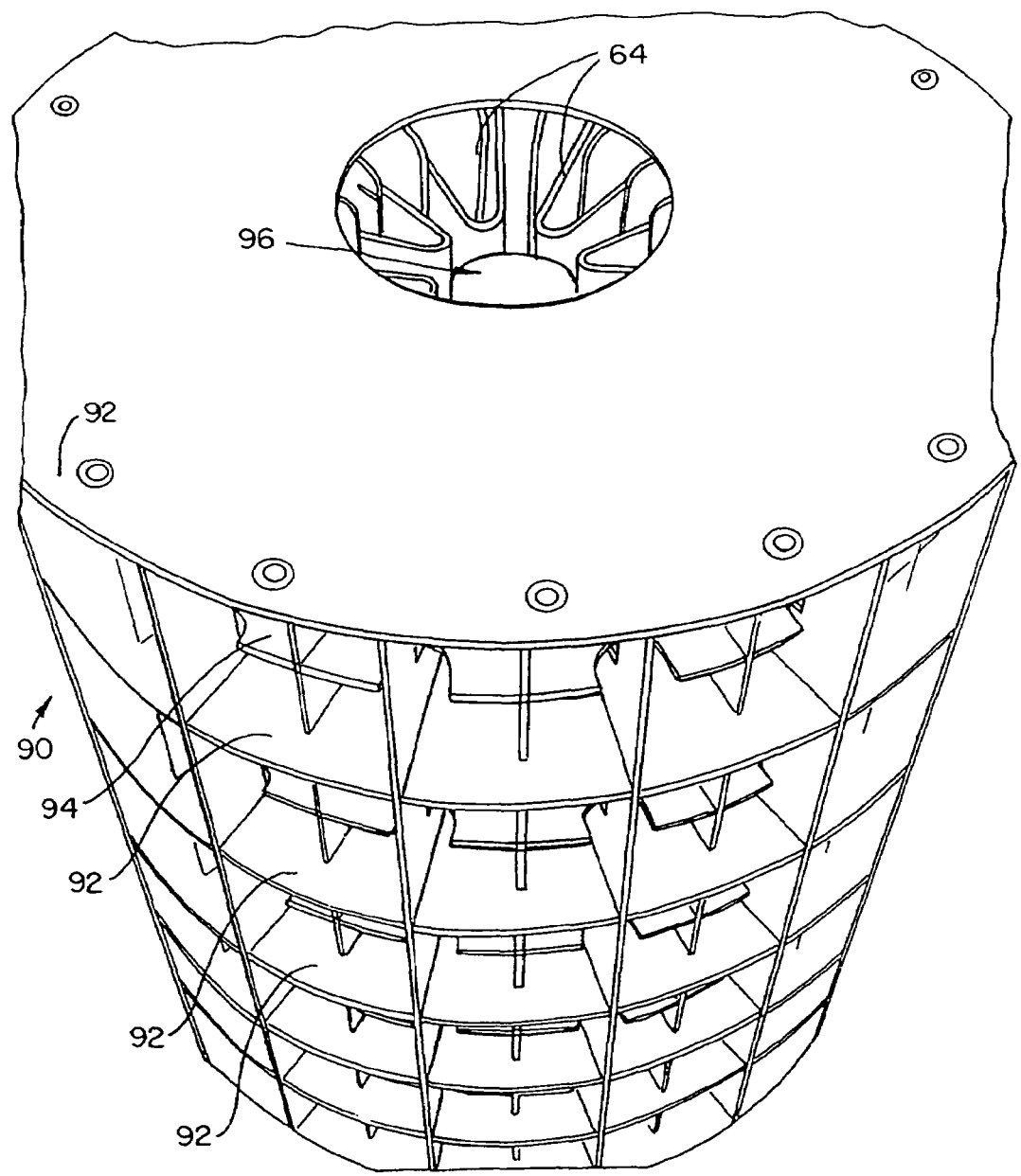
FIG. 9 is a side elevation view of a preferred electrode assembly comprising a stacked grid of "L7" electrode pairs as shown in FIGS. 6-8.
Figure 10:
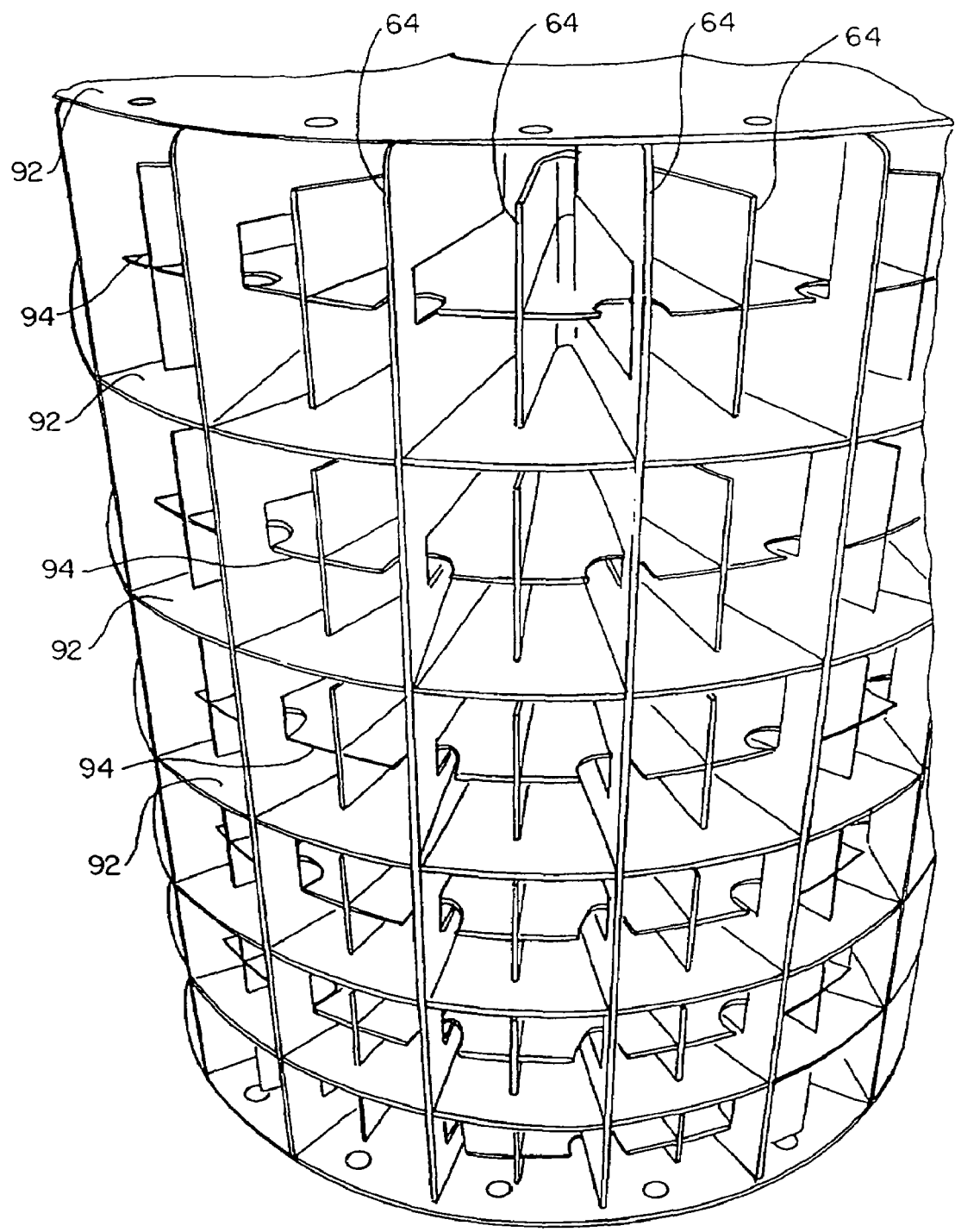
FIG. 10 is another side elevation view from a different elevation of the preferred electrode assembly of FIG. 9.

This can be seen in FIGS. 9 and 10, which are two side elevation views of a stacked "L7" electrode assembly of the type illustrated partially in FIGS. 5-8, from different elevations. In FIGS. 9 and 10, it is seen that the stacked electrode assembly comprises a series of alternating stacked electrodes 92 and 94. As shown in FIG. 5, electrodes 92 are connected in common to one terminal of a suitable power supply (not shown) and electrodes 94 are connected to the opposite terminal so that adjacent stacked electrodes 92 and 94 are of opposite polarity. Each electrode 92 is disk shaped with a central opening 96 to permit gas to flow from layer to layer of the stack. Each electrode 94 is also disk shaped, but without a central opening. Preferably the diameter of the electrodes 94 is slightly less than that of the electrodes 92 to permit gas flow over the outer edges of electrodes 94 from layer to layer of the stack. Obviously, electrodes 92 are electrically isolated from electrodes 94 via insulating spacers or the like. Electrodes 92 are formed with fins 64 that extend perpendicularly outwardly from each surface of each electrode 92 into proximity with but not into contact with adjacent electrodes 94 on either side of each electrode 92. Similarly, each electrode 94 has "horn" shaped fins 64 that extend perpendicularly outwardly from each surface of each electrode 94 into proximity with but not into contact with the surfaces of adjacent electrodes 92 on either side of each electrode 94. Further, the straight and horn shaped fins 64 are preferably staggered so that they interleave or interdigitate in the space between adjacent electrodes 92 and 94. With this configuration, the gas stream that enters the central opening 96 of first electrode 92 must follow a plurality of smaller paths that meander between the interleaved fins in the space between first electrode 92 and first electrode 94, before flowing over the outer edges of first electrode 94 to the next layer of the stack. There, the gas flows in multiple meandering paths between the interleaved fins in the space between adjacent second electrodes 92 and 94 to the central opening in the second electrode 92 and from there to the next layer of the stack, repeating the same meandering path through each layer of the stack until the last layer is traversed.

The electrodes 92 and 94 may be made of numerous suitable electrically conductive materials that are known to those skilled in the art and that have been conventionally used in plasma reactors in the past. The electrodes 92 and 94 illustrated in FIGS. 9 and 10 are preferably made of stainless steel for low cost construction. Insulating material sandwiching a conductive core can also be used when the power supply is a radio frequency type supply.

A further advantage of the preferred stacked "L7" electrode assembly configuration of the invention is that the partitioning of the space between the electrodes improves the quality of the plasma and hence the reaction efficiency of the reactor. The conceptual breakthrough is that a conventional parallel plate electrode pair may be viewed as two long parallel lines. Typically, the plasma is formed as a "sheet" in the central region of the space between the electrodes and has significant "blind spots" near the electrodes. The partitioning of the space between the electrodes with fin elements breaks up the parallel plate blind spot. For this purpose, the fin elements that partition the space between the electrodes could be two opposed plates having the same potential as the anode or cathode electrode, two L-shaped and two 7-shaped plates facing each other as "L7" facing plates. This arrangement of the "L7" shaped plates allows the plasma at the center of the channel to "see" essentially the entire space to all surfaces of the electrodes even though the center of the channel is where the plasma is being generated and maintained. This is because the ions and electrons generated at the center of the channel radiate out to all enclosing sidewalks formed by the electrodes and partitioning fin elements of each "cell" or partition to cause chemical reaction. Reaction efficiency is thereby greatly improved.

Additionally, in extended parallel plate electrode reactors, the plasma is generated and maintained as a lateral sheet between the opposing surfaces of the electrodes. This permits significant lateral chemical interaction in the plasma in the space between and parallel to the electrodes. Since this chemical interaction occurs in the gas phase, they are likely to form molecular clusters and coagulated particles called "plasma dust" that can be entrained in the gas stream and exit the reactor with the stream. This can cause serious problems, for example with downstream pumps, particularly if the "plasma dust" happens to be caustic or corrosive in nature. By partitioning the plasma "sheet" into individual cells or segments, the present invention greatly improves the control over the lateral chemical interaction that results in formation of plasma dust. Indeed, the "L7" design permits relatively easy manipulation by designers of the length of the flow path and the number of partitions to provide improved control over the desired surface reaction vs. gas phase reaction balance.

Nevertheless, it is sometimes desirable to have some communication of the plasma in adjacent cells or segments. For example, due to manufacturing tolerances or other reasons, there may be variations in the dimensions of adjacent partitions or other factors that would result in a weaker plasma being formed in one cell or partition than in adjacent cells or partitions. By permitting some communication between the plasma in adjacent cells or partitions, an equalizing effect is achieved wherein the stronger plasmas in adjacent cells or partitions can strengthen a weaker plasma in an adjacent cell or partition. Such communication can be accomplished partially or totally via the use of the corner gaps as shown in FIG. 4 or the gaps between fins 64 and adjacent surfaces of electrodes 52-58 shown in FIG. 5. If additional communication is desired, some or all of the fins may be provided with communication holes in their surfaces. The dimensions of the holes will of course depend on the application, the dimensions of the fins and electrodes themselves, and the desired operating parameters.

Yet another advantage of the preferred "L7" electrode configuration of the present invention resides in material strength considerations. Formation and maintenance of a plasma generates substantial heat. And, the greater the surface area of the electrodes and the higher the operating voltage, the more heat is generated. Thus, the electrodes are subject to considerable thermal deformation stresses. Conventional parallel plate electrodes comprising relatively large continuous sheets tend to accumulate large thermal stresses and are prone to structural deformation. Such deformation changes the electrode spacing and thereby the capacitance, electrical characteristics, and plasma properties. In some severe cases, the structural deformation can result in short circuiting. Such considerations must be taken into account when selecting the materials for the electrodes, etc. In contrast, the "L7" electrode structure, and particularly the stacked "L7" electrode assembly structure, comprise numerous smaller surfaces and interconnecting angled surfaces, which provide improved structural support and stability compared to large flat sheets. Also since the plasma is partitioned into smaller components, the overall cumulative thermal stress on the structure is reduced. The improved intrinsic structural strength allows the electrodes to be built with thinner sheet metal than has been previously possible in conventional parallel plate reactors designed for similar operating parameters and conditions. That in turn results in more space within the reactor interior volume to put in more surface area for a given compact volume, and to achieve even better performance.

FIG. 10 is a side elevation of a capacitively coupled parallel plate electrode plasma reactor embodying the preferred "L7" electrode configuration of the present invention. The reactor 110 has a housing enclosing an interior volume (not shown) in which the electrode assembly as shown in FIGS. 9 and 10 is mounted as a unit. The reactor housing may be opened and closed using conventional means. If desired, the housing may be provided with cooling surfaces for air cooling purposes. A conventional gas inlet 115 is provided for receiving a gas stream to be processed. A gas outlet 120 is also provided for the processed gas stream to exit the reactor. External electrodes (not shown) for connecting the terminals of a suitable power supply to the electrodes internal to the reactor, for example as shown in FIG. 5, are also provided.

Figure 11:
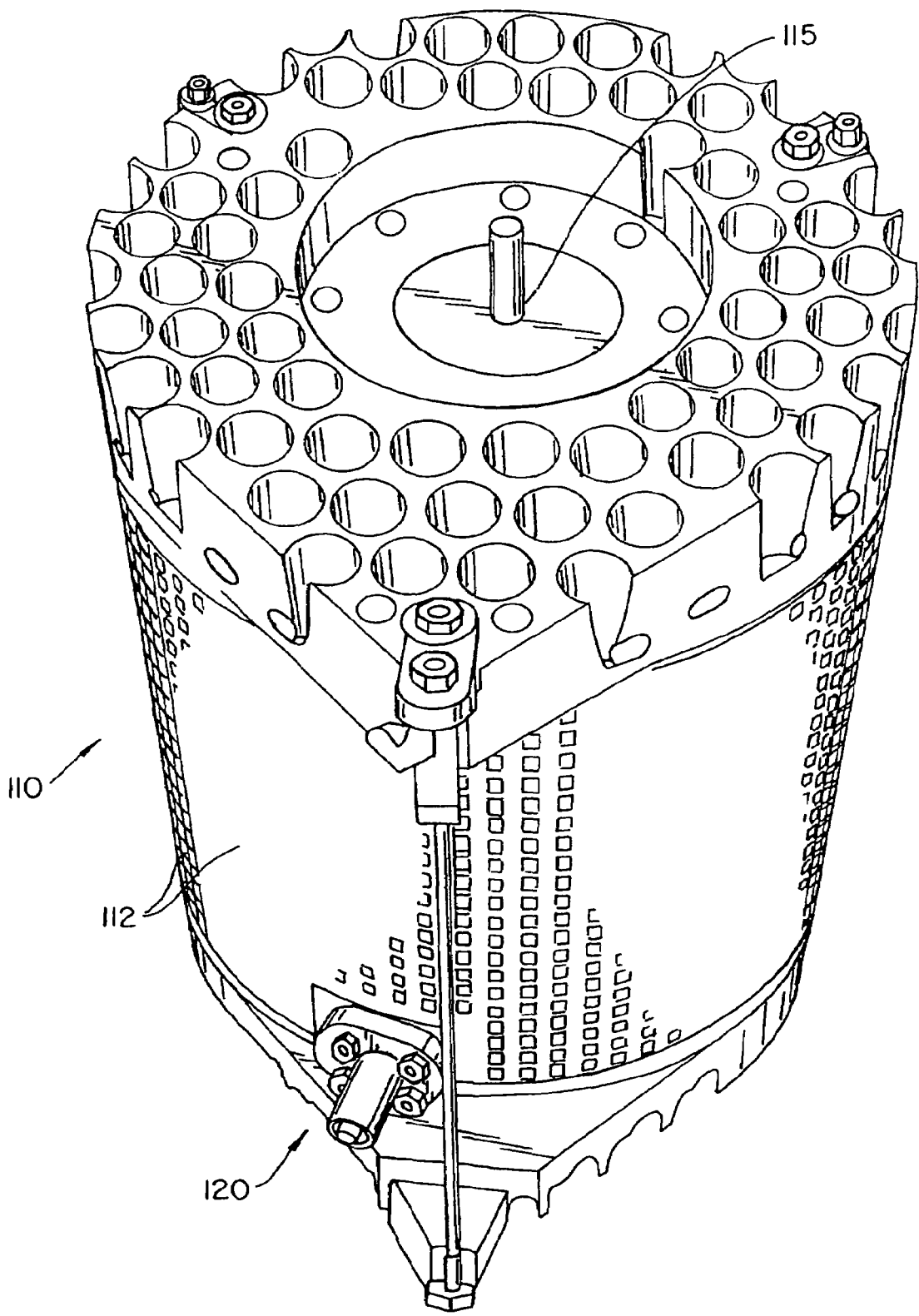
FIG. 11 is a side elevation view of a preferred embodiment of a capacitively coupled parallel plate gas plasma reactor embodying the present invention.

FIGS. 10 and 11 illustrate a gas plasma reactor according to the present invention, which has been constructed. As constructed, the reactor has a chamber defining a substantially cylindrical interior volume. The reactor has an external height of approximately 420 mm and a diameter of approximately 290 mm. The interior is approximately 305 mm in height and 254 mm in diameter. The chamber is constructed of aluminum and defines an interior volume of approximately 15,436 cm3. An electrode assembly, as shown in FIG. 10, made of 316 L stainless steel comprises 6 disk-shaped anode-cathode pairs. The spacing between adjacent anodes and cathodes is approximately 1 inch near the gas inlet of the reactor and is decreased slightly nearer the gas outlet of the reactor to promote gas processing efficiency as gas flows through the electrode assembly between the inlet and the outlet. The electrode assembly has an outer dimension slightly less than 254 mm and is approximately 300 mm tall. The anode disks are provided with center holes and the cathode disks have an outer dimension slightly less than the anode disks to provide a meandering gas flow path between adjacent anode-cathode pairs. Sixteen horn shaped fin elements are equally spaced around the circumference of each surface of each cathode and sixteen plate shaped fin elements are equally spaced around the circumference of each surface of each anode with the plate shaped fins being interleaved between each horn shaped fin and between each leg of each horn shaped fin (see FIG. 8). The horn shaped fins and plate shaped fins are spaced and dimensioned to define approximately one cubic inch segments or subdivisions of the flow path between adjacent anodes and cathodes. The total electrode area within the interior volume of the reactor is thus approximately 27,700 cm2 and the ratio of electrode surface area to volume is approximately 1.8.

Tests to initiate and maintain a plasma in air have been conducted using the foregoing reactor over a range of operating pressures and voltages. These tests have been conducted employing an Advanced Energy Industries Model 2500E power supply, modified to operate at 100 Khz. As modified, the power supply is load rated at approximately 1500 W. As tested, the reactor has successfully initiated and maintained a plasma in air at pressures up to 500 Torr at approximately 1000V with a load impedance of approximately 100 ohms and at pressures down to about 18 mTorr at approximately 1400V with a load impedance of approximately 1000 ohms.

The foregoing descriptions of the presently preferred embodiments of the invention are intended to be exemplary in nature rather than limiting. Various changes and modifications to the preferred embodiments will be apparent to readers skilled in the art and may be made without departing from the spirit of the invention. For example, various disclosed dimensions may be changed and different materials substituted for those disclosed. Different geometric shapes may be selected for the electrodes, the reactor chamber, the fin elements and the like, for example "U," "V," "W" shapes, or even cylindrical, spherical or conical shapes. Thus, the present invention virtually eliminates previous constraints and restrictions on electrode geometries and designs. Operating parameters may also be altered. The scope of the invention is intended to be defined and limited not by the specific details of the preferred embodiments, but by the appended claims.

What is claimed is:

1. A gas plasma reactor comprising:
a reactor chamber defining an interior volume and having a gas inlet and a gas outlet;
an electrode assembly positioned in said interior volume in communication with said gas inlet and said gas outlet, said electrode assembly adapted to be interposed in a flow of gas from said gas inlet to said gas outlet, said electrode assembly comprising:
a plurality of anodes and cathodes having a plurality of anode and cathode surfaces, wherein the anode and cathode surfaces face each other and are spaced apart from each other, defining a meandering flow path for a gas;
said anodes having a common electrical connector and said cathodes having a common electrical connector; and
a first electrically conductive fin element connected to a said anode surface and a second electrically conductive fin element connected to a said cathode surface, each of said first and second electrically conductive fin elements being interposed in the space between a said anode and cathode thereby partitioning said meandering flow path; and
an electrical connector for connecting a source of electrical power to said electrode assembly.

2. The gas plasma reactor of claim 1 wherein said plurality of facing anode and cathode surfaces provide a combined electrode surface area that facilitates gas reaction over the course of said flow path, and wherein said first and second fin elements are arranged to have facing, spaced apart surfaces, thereby increasing said electrode surface area to further facilitate said gas reaction.

3. The gas plasma reactor of claim 2 wherein said first and second fin elements are adjacent each other.

4. The gas plasma reactor of claim 3 wherein at least one of said first and second fin elements is shaped approximately as a "U", "V" or "W".

5. The gas plasma reactor of claim 4 wherein said plurality of facing surfaces of said anodes and said cathodes are substantially disk shaped and wherein said reactor chamber defines an interior volume that is substantially cylindrical.

6. The gas plasma reactor of claim 5 wherein at least one of said plurality of anodes and said plurality of cathodes has an opening in a said facing surface to facilitate gas flow between an adjacent anode and cathode.

7. The gas plasma reactor of claim 6 wherein at least one of said plurality of anodes and said plurality of cathodes has a diameter that is smaller than the diameter of the other to facilitate gas flow between adjacent anodes and cathodes.

8. The gas plasma reactor of claim 1 wherein each of said first and second fin elements extends outwardly from its corresponding anode and cathode surface respectively at an angle.

9. A gas plasma generator comprising:
a chamber defining an interior volume;
an anode and a cathode positioned in said interior volume and adapted to be interposed in a volume of gas, said anode and cathode each having a plurality of surfaces, said anode and cathode surfaces being interleaved with adjacent surfaces facing each other and spaced apart to define a volume for said gas;
a common electrical connector for each of said plurality of surfaces of said anode, and a common electrical connector for each of said plurality of surfaces of said cathode; and
a first electrically conductive fin element connected to an anode surface and a second electrically conductive fin element connected to a cathode surface, each of said first and second fin elements interposed in said volume between facing surfaces of said anode and said cathode thereby partitioning said volume.

10. The gas plasma generator of claim 9 wherein said first and second fin elements are arranged with facing, spaced apart surfaces, thereby increasing the electrode surface area in the volume between said facing surfaces of said anode and said cathode.

11. The gas plasma generator of claim 10 wherein said first and second fin elements are adjacent each other.

12. The gas plasma generator of claim 9 wherein at least one of said first and second fin elements is shaped approximately as a "U," "V," or "W."

13. The gas plasma generator of claim 9 wherein said facing surfaces of said anode and cathode are substantially disk shaped.

14. The gas plasma generator of claim 13 wherein said first and second fin elements are dispersed substantially circumferentially around said facing surfaces of said anode and cathode.

15. The gas plasma generator of claim 13 wherein at least some of said plurality of facing surfaces of said anode and said cathode have an opening to facilitate communication of gas between adjacent surfaces.

16. The gas plasma generator of claim 15 wherein at least some of said facing surfaces of said anode and said cathode have a diameter that is smaller than the diameter of an adjacent surface to facilitate communication of gas between adjacent surfaces.

17. The gas plasma generator of claim 9 wherein each of said first and second fin elements extends outwardly from its respective anode and cathode surface at an angle.

* * * * *